United States Patent
Li et al.

(10) Patent No.: US 9,449,866 B2
(45) Date of Patent: Sep. 20, 2016

(54) METHODS AND SYSTEMS FOR USING OXIDATION LAYERS TO IMPROVE DEVICE SURFACE UNIFORMITY

(71) Applicant: Shanghai Huali Microelectronics Corporation, Shanghai (CN)

(72) Inventors: Quanbo Li, Shanghai (CN); Jun Huang, Shanghai (CN); Xiangguo Meng, Shanghai (CN); Yu Zhang, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 1 day.

(21) Appl. No.: 14/590,011

(22) Filed: Jan. 6, 2015

(65) Prior Publication Data

US 2015/0270127 A1   Sep. 24, 2015

(30) Foreign Application Priority Data

Mar. 24, 2014 (CN) .......................... 2014 1 0110061

(51) Int. Cl.
*H01L 21/76* (2006.01)
*H01L 21/762* (2006.01)
(Continued)

(52) U.S. Cl.
CPC ... *H01L 21/76205* (2013.01); *H01L 21/02057* (2013.01); *H01L 21/302* (2013.01); *H01L 21/3065* (2013.01); *H01L 21/02238* (2013.01); *H01L 21/02252* (2013.01);
(Continued)

(58) Field of Classification Search
CPC .................. H01L 21/02164; H01L 21/02532; H01L 21/30604; H01L 21/76205; H01L 29/1054; H01L 29/66431; H01L 29/66575; H01L 29/66636; H01L 29/7848
USPC ........... 438/9, 425, 474, 513, 694, 700, 702, 438/703, 706, 710, 719, 723, 787, 788, 798, 438/911, 966, FOR. 117, FOR. 451
See application file for complete search history.

(56) References Cited

U.S. PATENT DOCUMENTS 6,906,400 B2   6/2005   Delhougne et al.
6,946,350 B2   9/2005   Lindert et al.
(Continued)

FOREIGN PATENT DOCUMENTS

EP       1801864 B1    11/2009

*Primary Examiner* — John P Dulka
*Assistant Examiner* — Joannie A Garcia
(74) *Attorney, Agent, or Firm* — Kilpatrick Townsend & Stockton LLP

(57) ABSTRACT

The invention discloses a treatment process for a semiconductor, comprising providing a substrate, the substrate comprises silicon material; defining a trench region; removing the trench region using a plasma etching process and exposing a trench surface, the trench surface comprising surface defects; forming an oxidation layer overlaying the trench surface; removing the oxidation layer and at least a portion of the surface defects; expositing a treated trench surface, the treated trench surface being substantially free from surface defects; and forming a layer of silicon germanium material overlaying the treated trench surface. The invention further provides a semiconductor processing technique used to eliminate or reduce dislocation defect on the semiconductor device and improve device performance. In the treatment process, a substrate is subjected to at least one oxidation-deoxidation processes, where an oxidation layer is formed and then removed.

16 Claims, 13 Drawing Sheets

(51) Int. Cl.
    *H01L 21/302* (2006.01)
    *H01L 21/3065* (2006.01)
    *H01L 21/02* (2006.01)
    *H01L 21/311* (2006.01)

(52) U.S. Cl.
    CPC .. *H01L 21/02381* (2013.01); *H01L 21/02532* (2013.01); *H01L 21/02639* (2013.01); *H01L 21/31116* (2013.01)

(56) References Cited

U.S. PATENT DOCUMENTS

| | | | |
|---|---|---|---|
| 6,949,482 | B2 | 9/2005 | Murthy et al. |
| 7,494,884 | B2 | 2/2009 | Lin et al. |
| 7,553,717 | B2 | 6/2009 | Chakravarthi et al. |
| 7,615,390 | B2 | 11/2009 | Meunier-Beillard et al. |
| 7,989,298 | B1 | 8/2011 | Chan et al. |
| 8,017,487 | B2 | 9/2011 | Chong et al. |
| 8,183,118 | B2 | 5/2012 | Lu et al. |
| 8,450,166 | B2 * | 5/2013 | Zhang ............... H01L 29/165 438/198 |
| 8,674,447 | B2 | 3/2014 | Adam et al. |
| 2005/0142298 | A1 * | 6/2005 | Kim ............... B82Y 10/00 427/532 |
| 2005/0148147 | A1 | 7/2005 | Keating et al. |
| 2006/0138398 | A1 | 6/2006 | Shimamune |
| 2008/0290370 | A1 | 11/2008 | Han |
| 2012/0309151 | A1 * | 12/2012 | Zhang ............... H01L 29/165 438/285 |
| 2012/0319120 | A1 | 12/2012 | He et al. |
| 2012/0319168 | A1 | 12/2012 | Liu et al. |
| 2012/0326268 | A1 | 12/2012 | Kato et al. |

\* cited by examiner

METHODS AND SYSTEMS FOR USING OXIDATION LAYERS TO IMPROVE DEVICE SURFACE UNIFORMITY

CROSS-REFERENCES TO RELATED APPLICATIONS

This application claims priority to Chinese Patent Application No. 201410110061.3, filed Mar. 24, 2014, which is incorporated by reference herein for all purposes.

BACKGROUND OF THE INVENTION

The present invention is directed to semiconductor processes and devices.

Since the early days when Dr. Jack Kilby at Texas Instruments invented the integrated circuit, scientists and engineers have made numerous inventions and improvements on semiconductor devices and processes. The last five decades or so have seen a significant reduction in semiconductor sizes, which translates to ever increasing processing speed and decreasing power consumption. And so far, the development of semiconductors has generally followed Moore's Law, which roughly states that the number of transistors in a dense integrated circuit doubles approximately every two years. Now, semiconductor processes are pushing toward below 20 nm, where some companies are now working on 14 nm processes. Just to provide a reference, a silicon atom is about 0.2 nm, which means the distance between two discrete components manufactured by a 20 nm process is just about one hundred silicon atoms.

Manufacturing semiconductor devices are thus becoming more and more challenging and pushing toward the boundary of what is physically possible. Huali Microeletronic Corporation™ is one of the leading semiconductor fabrication companies that has focused on the research and development of semiconductor devices and processes.

One of the recent developments in semiconductor technologies has been utilization of silicon germanium (SiGe) in semiconductor manufacturing. For example, SiGe can be used for manufacturing of complementary metal-oxide-semiconductor (CMOS) with adjustable band gap. While conventional techniques exist for SiGe based processes, these techniques are unfortunately inadequate for the reasons provided below. Therefore, improved methods and systems are desired.

Figure 1A:
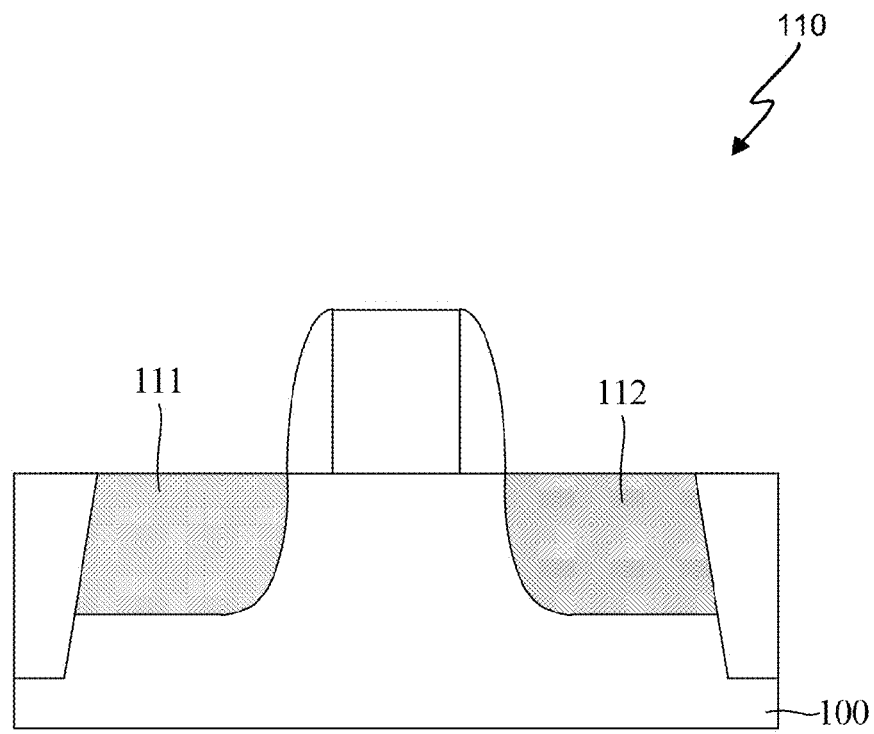
FIG. 1A-1C illustrate schematic diagrams of a device structure manufactured by e-SiGe PMOS method in the prior art.

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

The present invention is directed to semiconductor processes and devices. In a specific embodiment, an oxidation layer is used as an intermediate layer during one of the semiconductor processes to improve surface uniformity of the underlying semiconductor device. There are other embodiments as well.

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment. It is understood that various changes may be made in the function and arrangement of elements without departing from the spirit and scope as set forth in the appended claims.

This disclosure relates in general to a semiconductor processing technique used to eliminate or reduce dislocation defect on the semiconductor device and improve device performance. In the treatment process, a substrate is subjected to at least one oxidation-deoxidation processes, where an oxidation layer is formed and then removed. The substrate comprises semiconductor materials. More specifically, a surface of the substrates has undesirable defects. The oxidation-deoxidation layer treatment comprises the steps of subjecting the surface of the substrate to an oxidation process, which results in forming an oxidation layer on the surface of the substrate. During the process of removing the oxidation layer, some of the undesirable defects that were present on the surface of the substrate prior to the oxidation process are removed, and the surface of the substrate is revealed, now with substantially less undesirable surface defects. Compared with the prior art, the defects on the surface of the substrate can be reduced or eliminated by the oxidation-deoxidation layer treatment, so that the surface of the substrate is substantially flat and uniform, and these characteristics are important for the subsequent processes. For example, to fill the etched trench with filling materials, the quality of the filling material and the structure depend on the surface flatness and uniformity. More specifically, the filling material shares an interface with the surface of the substrate, and poor uniformity of the surface of the substrate can lead to poor interface between filling material the surface of the substrate.

It is appreciated that the quality of the surface of the substrate can have significant impact on the integrated circuits that are formed thereon. For example, a large-scale integrated circuit needs a large number of transistor units to manufacture. The transistor units make up for the main circuit element for designing the circuit. In certain applications, such as complex integrated circuits (such as microprocessor and storage wafer), complementary metal oxide semiconductor (CMOS) technology can provide desired characteristics of operation speed, power consumption and cost benefit. It is thus to be appreciated that CMOS (including P-channel transistor and N-channel transistor, namely, PMOS and NOMS) technology can benefit from the processes and systems according to embodiments of the present invention. For example, N-channel transistor or P-channel transistor comprises a P-N interface that is formed by a high doped drain area and a source area, as well as an interface of reversely or weakly doped channel area between the drain area and the source area. The conductivity of the channel area (namely, drive current ability of the conductive channel) is dictated by the gate electrode formed around the channel area and separated by a thin insulating layer. When a suitable control voltage is applied to the gate electrode to form the conductive channel, the conductivity coefficient of the channel area depends on dopant concentration, charge carrier mobility, and distance (also named as channel length) between the source area and the drain area as far as the given extension of the channel area in the width direction of the transistor. The reduction of channel length and the resistivity of the related channel resistance are the main design objectives for increasing the operation speed of the large-scale integrated circuit.

There have been various ways in improving performance and reliability of integrated circuits. With continuous reduction of critical dimension, new development of highly complex technology is needed. More specifically, the reduction of the migration rate is likely to provide performance gain, and thus it has been suggested that the channel conductivity of the transistor unit can be improved by increasing the charge carrier mobility in the channel area with given length.

An effective method for increasing the charge carrier mobility is to modify the lattice structure in the channel area. For example, stretching or compression stress is generated around the channel area to provide corresponding strain in the channel area, which causes the changed migration rate of the electronic and cavity. Whereas substrate comprises silicon material, the stretching strain generated in the channel area can increase the migration rate of the electronic and increase the conductivity directly. On the other hand, the compression strain in the channel area can increase the migration rate of the cavity, and thus it can improve the performance of P-type transistor. In various implementations, stress or strain engineered into to the large-scale integrated circuit, where the strained silicon can be regarded as the new semiconductor material that can be manufactured quickly and strongly without expensive or inexpensive semiconductor material. In addition, integrated circuits with engineered strains and/or stress can be manufactured by many existing techniques.

The silicon-germanium material adjacent to the channel area can induce compression strain of the corresponding train. In conventional CMOS manufacturing techniques, silicon germanium material (e.g., e-SiGe) adds compressive stress in the channel area to boost the performance of PMOS. More specifically, the silicon-germanium material is formed in the drain and source areas of the transistor. The drain and source areas of the compression strain generate a single-shaft stress in the adjacent silicon channel area. When the silicon-germanium material is formed, the drain and source areas of the PMOS transistors are selectively removed to form a cavity. The NMOS transistor is shielded. The silicon-germanium material is selectively formed in PMOS transistor by epitaxial growth.

As an example, SiGe technology refers to a SiGe heterojunction bipolar transistor (HBT) that offers advantages over both conventional silicon bipolar and silicon CMOS for implementation of communications circuits. An important aspect of forming SiGe-based devices is to provide matching lattice structure between Si substrate and SiGe fillings. For example, because of difficulties in growing lattice-matched SiGe alloy on Si, uniformly growing SiGe at the Si-STI interface is desirable to increase the performance of the CMOS device. In an embodiment, an SiGe CMOS manufacturing process may cause various detention of logic gate patterning, such as 45/40 nm, 32/28 nm, and <22 nm.

Figure 1B:
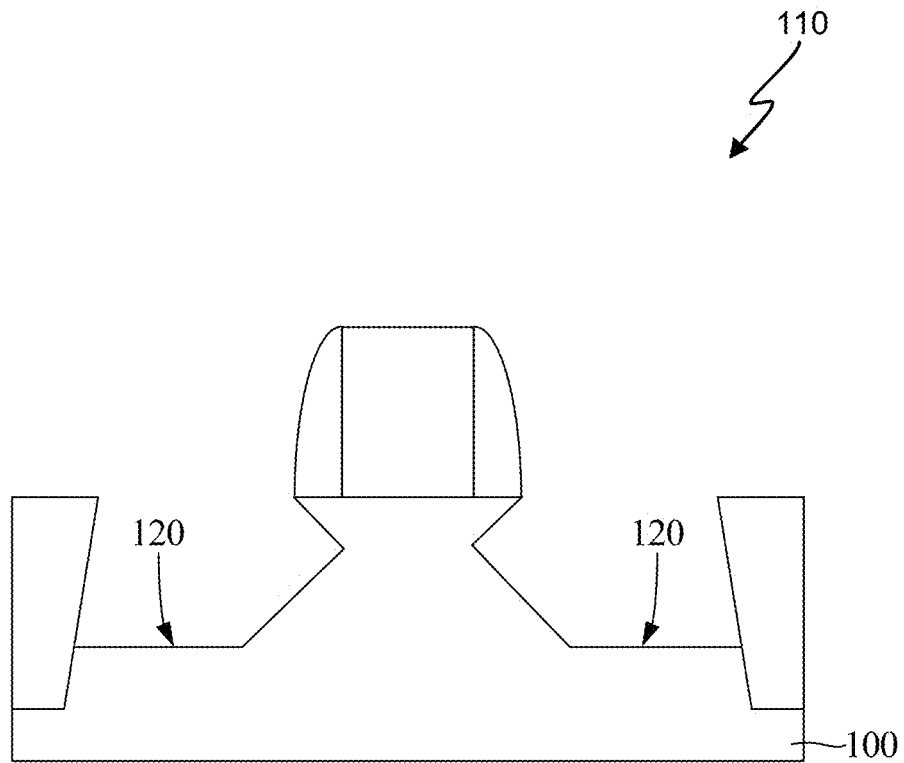
Figure 1C:
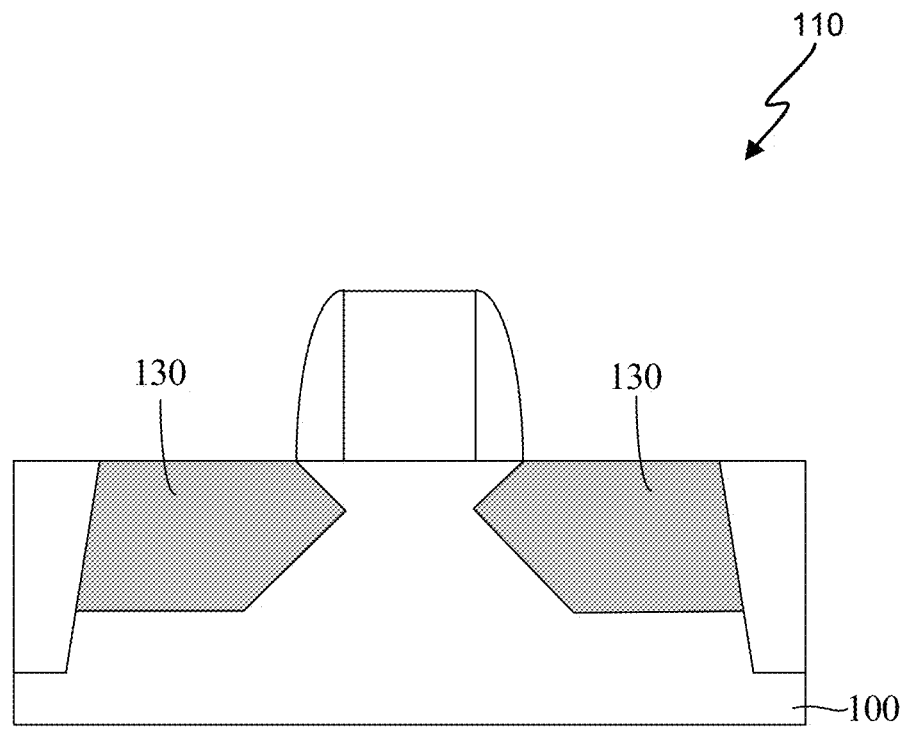
Figure 2:
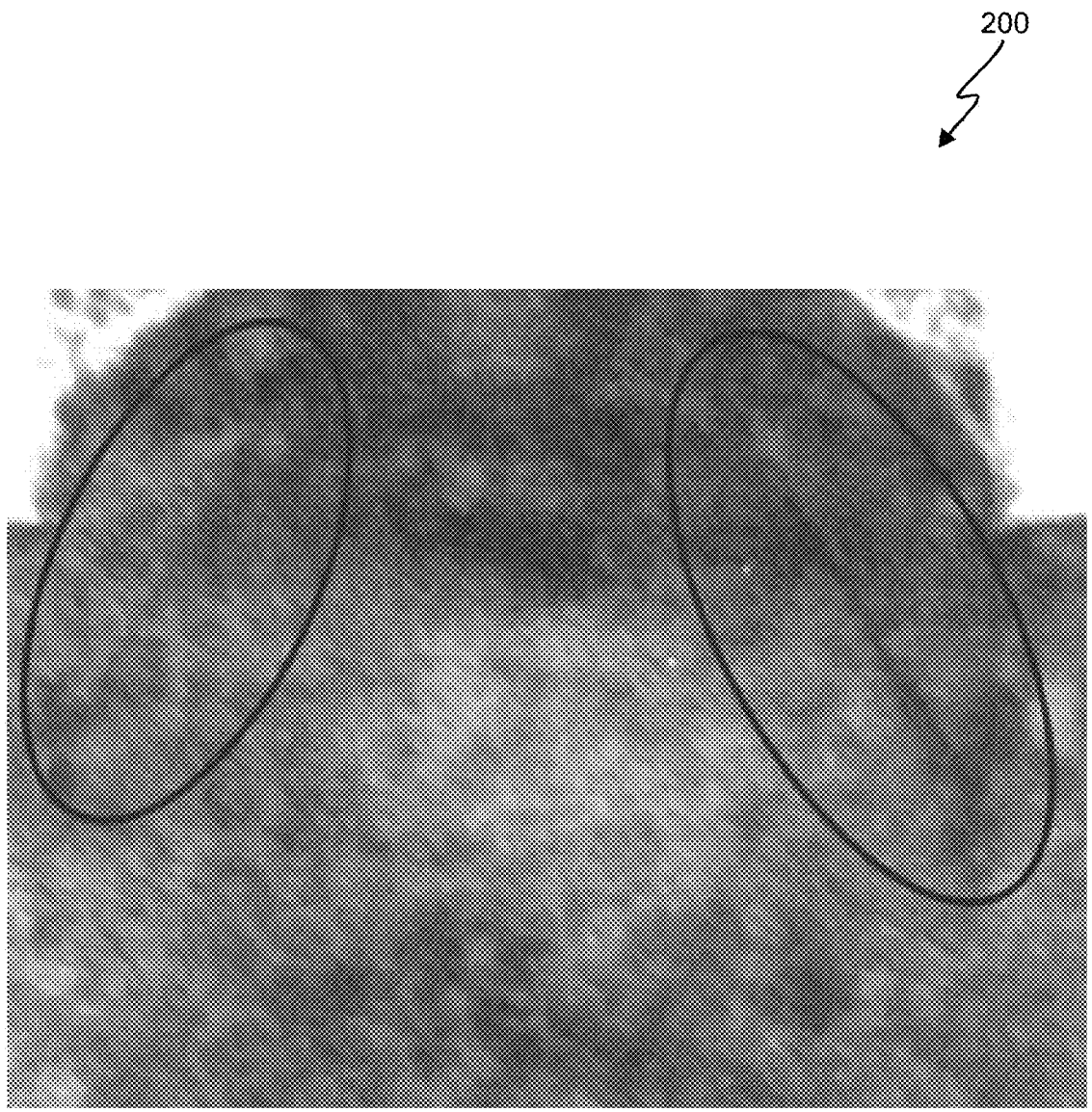
FIG. 2 illustrates an example of a transmission electron microscopy (TEM) photo of an e-SiGe film in prior art.

FIG. 1A-1C illustrate conventional plasma etching processes. Typically, plasma etching technology is adopted during the process of forming a trench region 120 in the source area 111 and drain area 112. When the plasma etches the silicon substrate 100, the plasma strafes the surface of the silicon substrate 100. FIG. 2 illustrates an example of a transmission electron microscopy (TEM) photo of an e-SiGe film in prior art. Uneven surface of trench region 120 is attributed to the convention plasma process as shown in two circled regions of a SiGe film in FIG. 2. More specifically, the two circle regions in FIG. 2 highlight the surface defects, which are seen as dark lines. For example, the defects are often associated with lattice mismatch at the atomic level. More specifically, due to dislocation of underlying lattice structure, a SiGe film overlying the surface defects of the silicon material often includes "lines" as shown in FIG. 2, as the dislocation and poor alignment of the underlying silicon material cascade into the SiGe film.

Figure 3:
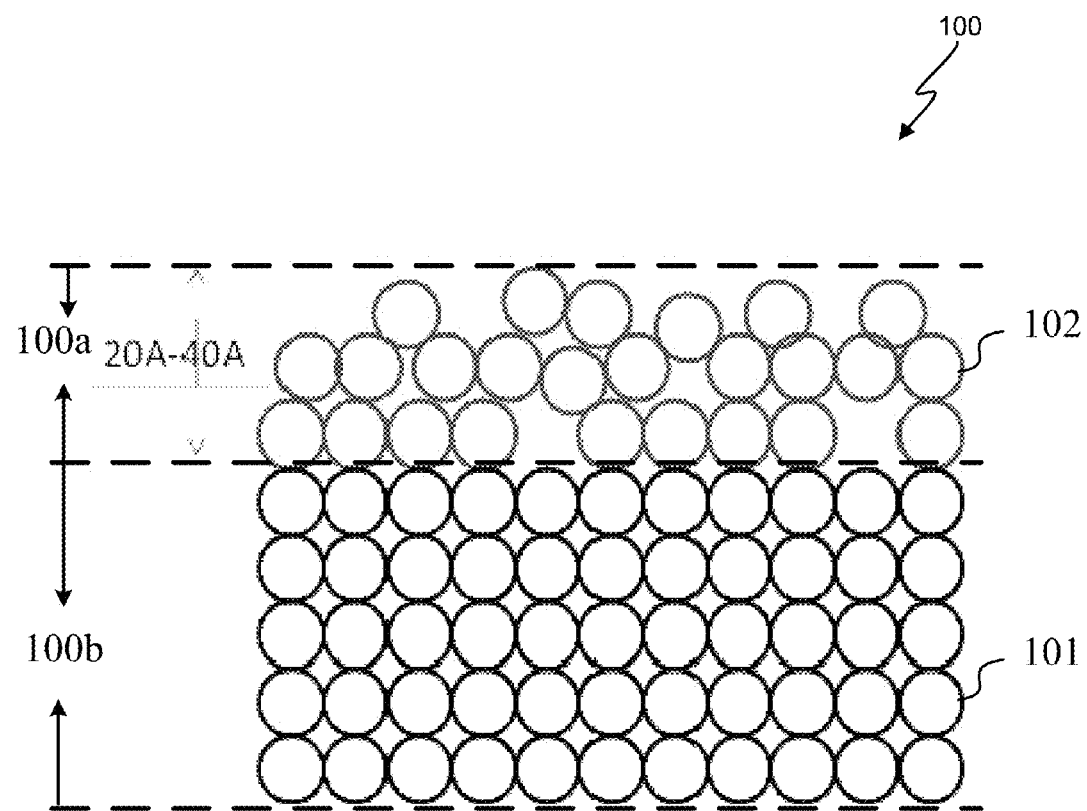
FIG. 3 illustrates an atomic arrangement schematic diagram of a silicon substrate in prior art.

FIG. 3 illustrates an example of the atomic arrangement schematic diagram of silicon substrate in prior art. FIG. 3 shows the atomic arrangement of silicon substrate 100 at the bottom of the trench region 120. The silicon substrate 100 comprises a surface region 100a and a bottom region 100b. In the bottom region 100b, silicon atoms 101 are regularly arranged along the lattice direction. For example, the silicon substrate is substantially crystalline. Near the surface region 100a, the strafing of the plasma disrupts the arrangement and uniformity among the silicon atoms 101, and as a result the silicon atoms near the surface region 100a are irregularly arranged. Depending on the process, the surface region 100a may have a thickness of about 20 angstroms to 40 angstroms. Additionally, some byproduct 102 (such as polymer) is likely to generate during the etching process. In FIG. 3, the byproduct is adhered to the surface of the silicon substrate 100, so it causes uneven surface of the trench region 120. The combination of disordered silicon atoms and the byproducts contribute to dislocation defects, which may cause stress in the SiGe layer that is later formed on top of the trench region 120. For example, the thickness of the surface region 100a or the damaged silicon atom layer is around 2 nm to 4 nm.

There could be various reasons for the dislocation defects. For example, during the process that the strain induction layer 130 is formed in the trench region (as shown in FIG. 1C), when the silicon-germanium layer is formed, the unevenness of the surface of the trench region 120 affects the formation of silicon-germanium crystal nucleus, so that the silicon-germanium material is misplaced, and dislocation defets are formed.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

Embodiments of the present invention provide ways of addressing the dislocation defect issues described above. According to embodiments of the present invention, the silicon-germanium layer can grow regularly along the lattice direction if the surface of the trench region 120 is substantially flat and uniform. In various implementations described below, the surface of the trenched region (e.g., etched by plasma etching) is processed to be substantially flat and uniform, which translates a uniformity and regularity in the silicon germanium material that overlays the surface of the trenched region.

Embodiments of the present invention relate in general to treatment process for a semiconductor. According to an embodiment, the present invention provides a process that include providing a substrate and subjecting at least one oxidation-deoxidation layer treatment to the substrate, where the oxidation-deoxidation layer treatment comprises the steps of subjecting oxidation treatment to the surface of the substrate, forming an oxidation layer on the surface of the substrate, removing the oxidation layer and revealing the substrate. The oxidation layer selectively binds surface defects, and when the oxidation layer is removed, surface defects of the substrate is removed as well. Depending on the implementation, the oxidation process can be repeated to ensure a desired surface quality if achieved. The defects on the surface of the substrate can be reduced or eliminated by the oxidation-deoxidation layer treatment, so that the surface of the substrate is flat and the flat surface helps the next process.

Further, the treatment process for a semiconductor can be applied in the preparation method for the semiconductor device; and the preparation method for the semiconductor device comprises the following steps of: providing a substrate, the substrate comprises silicon material; defining a trench region; removing the trench region using a plasma etching process and exposing a trench surface, the trench surface comprising surface defects; forming an oxidation layer overlaying the trench surface; removing the oxidation layer and at least a portion of the surface defects; expositing a treated trench surface, the treated trench surface being substantially free from surface defects; and forming a layer of silicon germanium material overlaying the treated trench surface. It is to be appreciated that one or more of these steps may be added, removed, repeated, replaced, modified, rearranged, and/or overlapped, which should not limit the scope of the claims.

Figure 4:
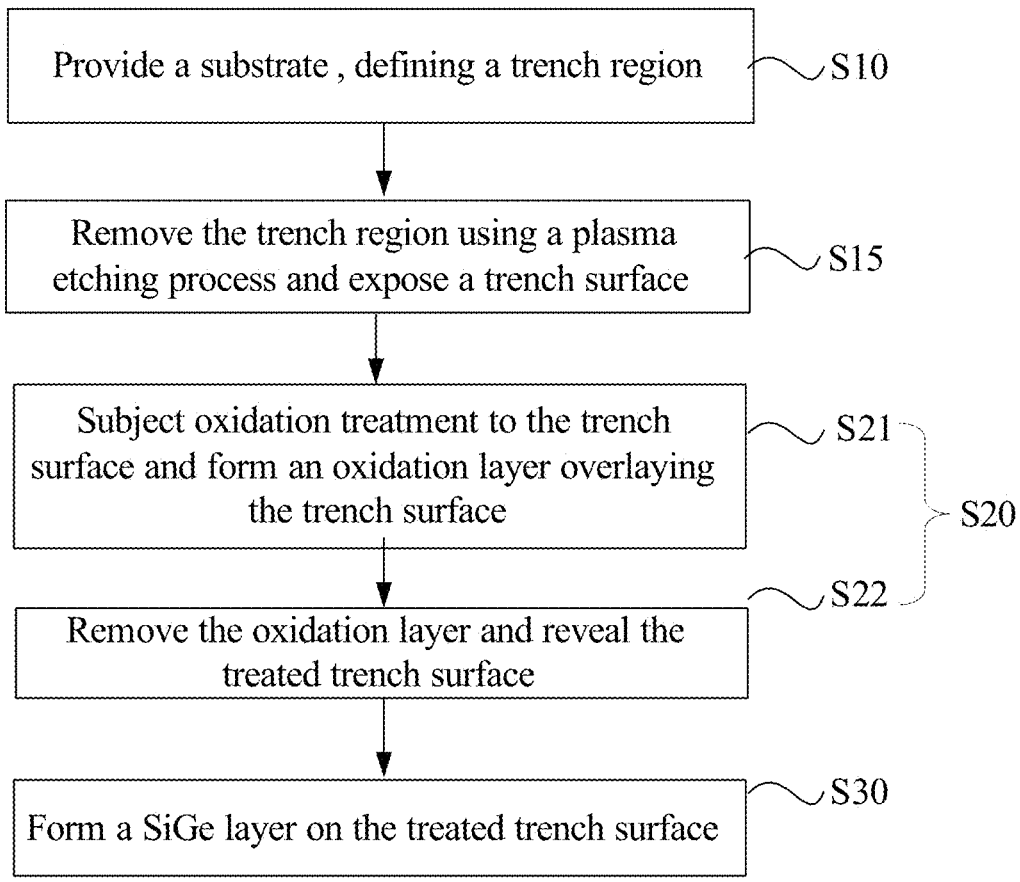
FIG. 4 illustrates a flow chart of a preparation method according to an embodiment of the present invention.

The treatment process for the semiconductor and the preparation method for a semiconductor device provided by the invention are described in details by combining FIG. 4, and FIG. 5A-5D. FIG. 4 is a simplified flow chart of the preparation method for semiconductor method in one embodiment of the invention. This diagram is merely an example, which should not unduly limit the scope of the claims. One of ordinary skill in the art would recognize many variations, alternatives, and modifications. For example, one or more steps in FIG. 4 can be added, removed, replaced, rearranged, modified, and/or overlapped, which should not limit the scope of the claims. FIG. 5A-FIG. 5D are simplified schematic diagrams of device structure in the preparation method for semiconductor method in one embodiment of the invention. In an embodiment, the treatment process for the semiconductor is applied in the preparation method for the semiconductor device; the substrate corresponds to the substrate in the treatment process for the semiconductor; and at least one oxidation-deoxidation layer treatment to the trench region corresponds to at least one oxidation-deoxidation layer treatment to the substrate.

Figure 5A:
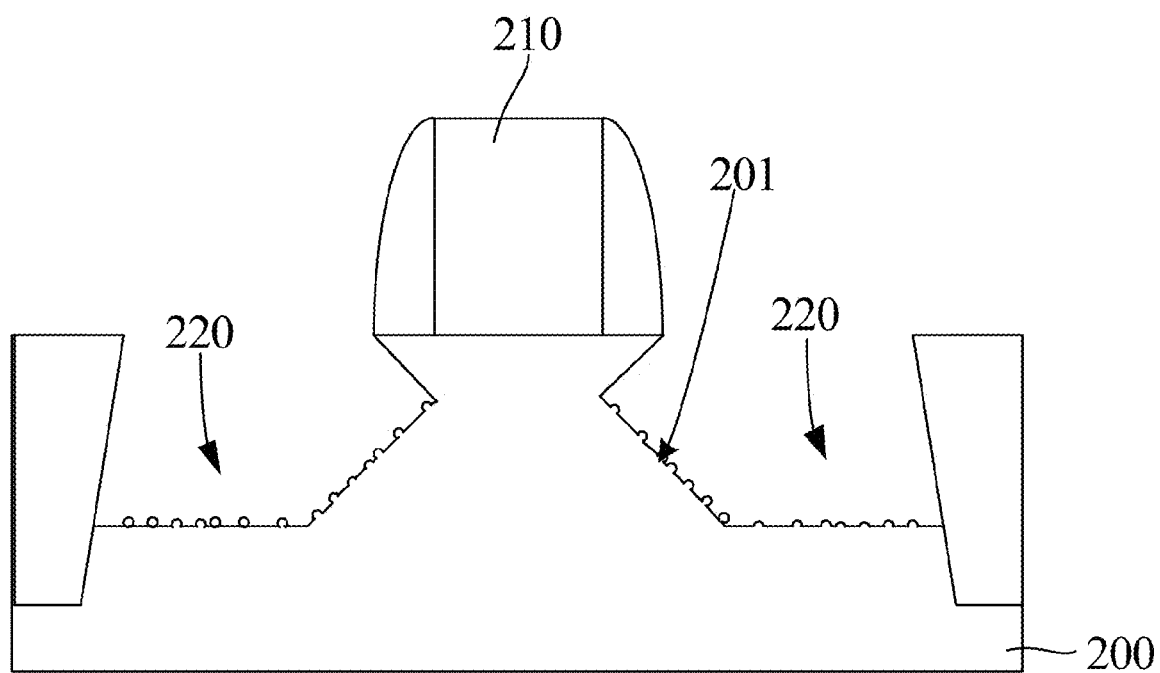
FIG. 5A-5D illustrate schematic diagrams of device structures in the preparation method according to an embodiment of the present invention.

Firstly, at step S10, a substrate 200 is provided, trench region 220 is defined on the substrate 200, as shown in FIG. 5A. In an embodiment, the substrate 200 is a silicon substrate. The substrate 200 is not limited to the silicon substrate. For example, the substrate 200 can be silicon-germanium substrate or silicon-carbon substrate which is in the scope of the invention. In an embodiment, the substrate 200 further comprises additional device structure, such as grid 210. The trench region 220 can be formed by an etching process. For example, lithography is performed to define the trenches to be formed, and plasma etching process is performed to form the trenches. Depending on the implementation, other types of methods may be used as well to define the trench region(s).

In step S15, a plasma etching process is used to remove the trench region 220. A trench surface comprising surface defects is exposed. The surface of trench region 220 is damaged during the process of preparing the trench region 220, and an uneven rough surface 201 is formed, as shown in FIG. 5A. For example, the damage is often caused by the etching process. For example, during a plams etching process, HCl and/or other types of material are used to remove materials from the substrate. The newly exposed surface is typically uneven since a layer of substrate material is removed. Additionally, since HCl and/or other type of etchants are used during the etching process, etchants may stay on the top surface of the trench region 220 as byproducts described above.

Next, the step S20 is carried out. At least one oxidation-deoxidation layer treatment is carried out to the trench region 220. Depending on the implementation, step S20 may be repeated. The oxidation-deoxidation layer treatment comprises two substeps, S21 and S22. In an embodiment, a cleaning step can be carried before carrying out step S20, to remove the residue in trench region 220. Preferably, it is cleaned by the wet process.

Figure 5B:
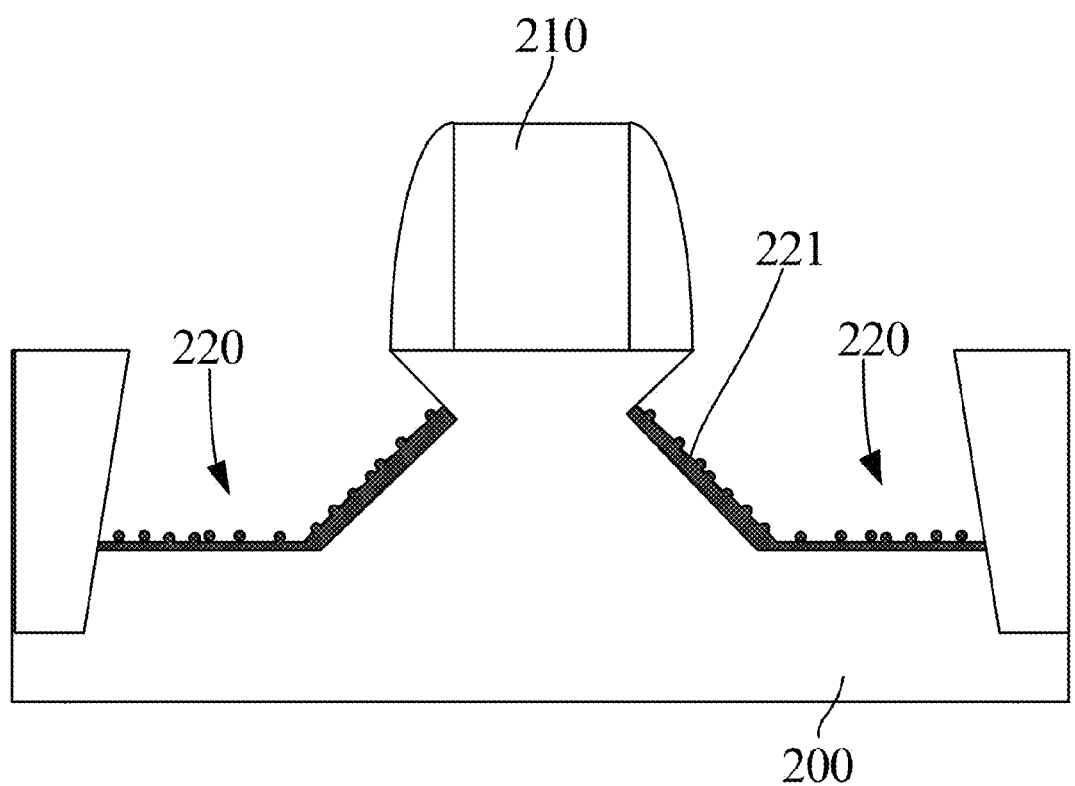

At substep S21, the surface of the trench region 220 is subjected to oxidation treatment. For example, an oxidation layer 221 is formed on the surface of the trench region 220 as shown in FIG. 5B. Preferably, the surface of the trench region 220 is subjected to oxidation treatment by the plasma etching apparatus. The plasma etching apparatus can etch the trench region 220 directly without using additional systems or devices. For example, the thickness of the oxidation layer 221 is normally between 2 nm-8 nm, for example, 2 nm, 4 nm, 6 nm and the like. It is to be understood that the thickness of the oxidation layer 221 is not limited in the above scope and the thickness is in the nano meter order and less than micro meter order. For example, during the removing process, thick oxidation layer may damage the surface of the trench region 220. Instead of forming thick oxidation layer 221, the oxidation-removal process may be repeated to smoothen the trench surfaces.

In a specific embodiment, process conditions of the plasma etching machine in substep S21 are as follows: the flow of the oxide gas is 20 sccm (standard-state cubic centimeter per minute)-50 sccm (such as 30 sccm, 40 sccm); the source power is 300 w-500 w (such as 400 w); the bias voltage is 0; and the time is 5 s-15 s (such as 8 s, 10 s, and 12 s). Preferably, the oxide gas is oxygen and not limited in the oxygen; it can be ozone and the gas capable of dissolving the oxygen atom. In an embodiment, the process conditions of the plasma etching machine in substep S21 are as follows: pressure is 10 mt; the source power is 150 w; bias voltage is 0; the flow of the oxide gas is 30 sccm-50 sccm; temperature is 50° C.-70° C.; and the time is 5 s-10 s. In an embodiment, the process conditions of the plasma etching machine in substep S22 are as follows: pressure is 20 mt; the source power is 150 w; bias voltage is 0; the flow of NF3 gas or SF6 (etching gas) gas is 5 sccm-20 sccm; the flow of ChxFy gas (polymer gas) is 5 sccm-10 s sccm; and the temperature is 50° C.-70° C. The use is ChxFy gas may increase the ratio of $SiO_2$ Vs Si (>1:1). It is to be appreciated that these parameters can largely depend on the material and machine used, and can be modified to depending on the specific implementations. For example, the source power depends largely on the operating efficiency and setup of the machines. Additionally, temperature and pressure are interrelated. For example, pressures tends to go up as temperature goes up.

A thin and uniform oxidation layer can be formed on the surface of the trench region 220 by the above process conditions. The process conditions are not limited in the above scope. Embodiments of the present invention provides an oxidation layer 221 that is formed with sufficient thickness to later allow for smoothening of the trench surface. For example, the oxidation layer 221 can also be formed by the thermal oxidation process. In various embodiments, the oxidation layer 221 is substantially even and uniformed when formed using the oxidation process described above.

Figure 5C:
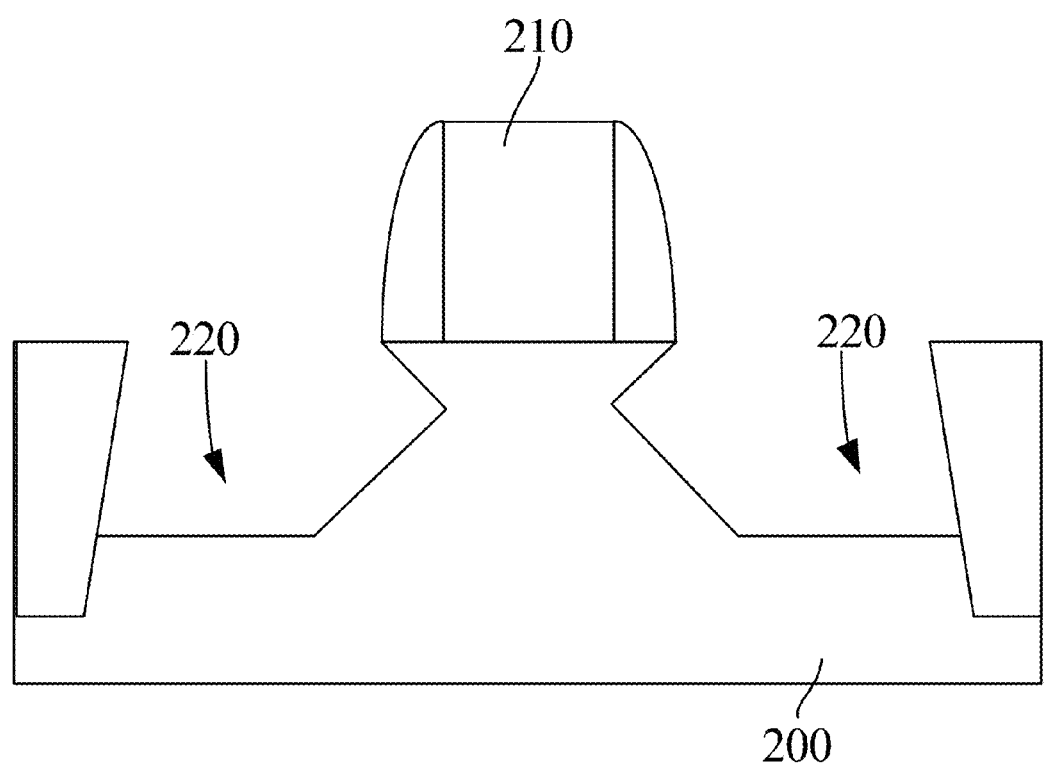

At substep S22, the oxidation layer 221 is remove. Once the oxidation layer 221 is removed, a treated trench surface is once again exposed, as shown in FIG. 5C. The oxidation layer 221 can be removed in various ways. Preferably, it can adopt the plasma etching machine directly etching the trench region 220 without using a new machine. Preferably, substep S21 and substep S22 are carried out on the same plasma etching machine, so that the oxidation-deoxidation layer treatment is carried out in the same machine. It is to be appreciated that when the substep S21 and substep S22 are to be repeated several times, the substrate 200 is not replaced among different machines so as to save process. According to certain embodiments, the plasma etching machine is carried out below 200° C. and has low thermal budget. In an embodiment, the plasma etching machine is carried out below 100° C. For example, the temperature at the plasma etching machine is predetermined according to a set of predefined thermal budget parameters.

In an embodiment, the process conditions of the plasma etching machine in substep S22 are as follows: the flow rate of the oxide gas is 10 sccm-50 sccm (such as, 20 sccm, 30 sccm, 40 sccm); the source power is 200 w-400 w (such as 300 w); the bias voltage is 0; and the time is 5 s-15 s (such as 8 s, 10 s and 12 s); the relative molecular mass of the gas is not greater than 100 (the smaller relative molecular mass avoids great strafing force and unevenness to the surface of the trench region 220); in gas molecule, the carbon content is not greater than 30% (avoid more by-product and unevenness to the surface of the trench region 220). Preferably, the gas is nitrogen trifluoride, carbon tetrafluoride, fluoroform and/or sulfur hexafluoride. The processing conditions are not limited in the scope; as long as removing the oxidation layer 221 and damaging the surface of the trench region 220, it is in the scope of the invention.

According to certain embodiments, the oxidation layer 221 is removed by a wet etching process, which results in exposing the treated trench surface. Depending on the implementation, the wet etching process can be performed using one or more etching systems. It is to be appreciated that during the removal process, materials and particles, which includes substrate material and/or byproducts, that contribute to uneven surface of the trench surface are removed along with the oxidation layers. For example, the oxidation layer selectively binds with the surface defects, thereby allowing the surface defects to be easily removed at step S22.

In step S21, the uneven rough surface 201 is oxidized to a rough oxidation layer. The rough oxidation layer is removed when carrying out step S22 so that the treated trench surface being substantially free from surface defects. If the circulation of step S21 and step S22 dose not reach the effect, it can repeat step S20 until the trench region 220 is flat and uniform. Depending on the implementation, the number of iterations of performing step S20 can be based on a predefined processes or determine by empirical data. For example, the type of plasma etching performed at S15 may affect the number of iterations.

Figure 5D:
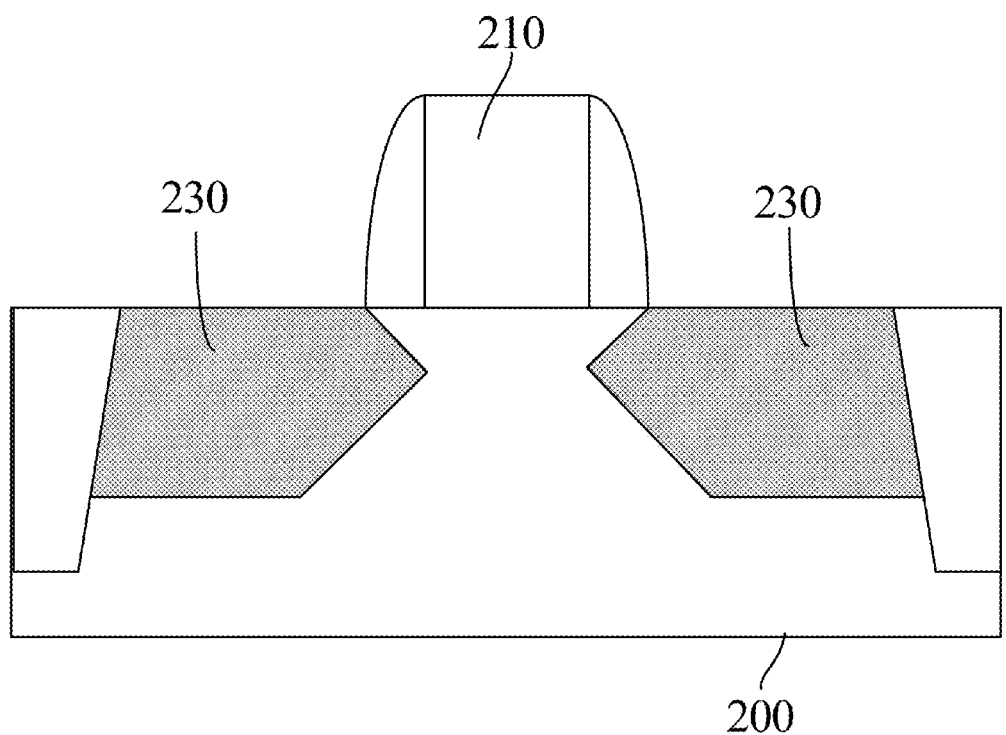

Carrying out step S30, a layer of silicon germanium material is formed overlaying the treated trench surface, as shown in FIG. 5d. The substrate 200 is the silicon substrate. The strain induction layer 230 can be made of silicon-germanium and not limited to silicon-germanium. It is to be appreciated that after step S30, additional processes are performed to form the desired devices. For example, to form a CMOS devices, additional processes are performed to form drain, source, and gate regions.

Figure 6:
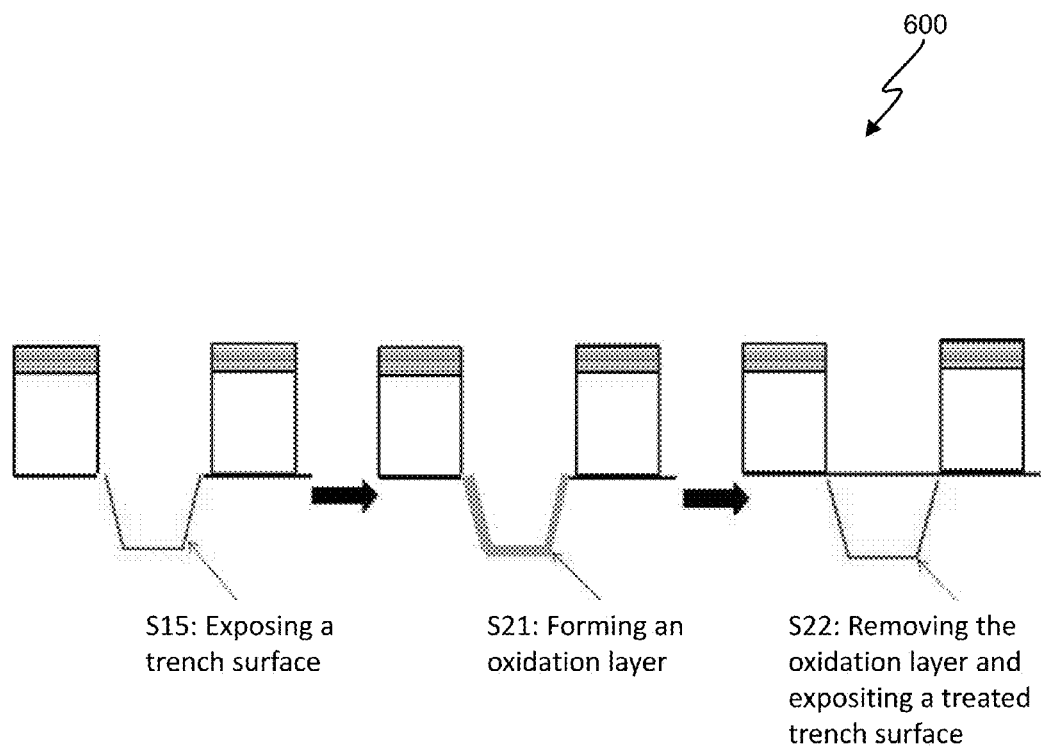
FIG. 6 illustrates a simplified flow diagram of the preparation method for semiconductor method in one embodiment of the invention.

FIG. 6 is a simplified flow diagram 600 of the preparation method for semiconductor method in one embodiment of the invention. This diagram is merely an example, which should not unduly limit the scope of the claims. One of ordinary skill in the art would recognize many variations, alternatives, and modifications. For example, exposing a trench surface by removing the trench region using a plasma etching process as discussed in step S15 of FIG. 4; forming an oxidation layer overlaying the trench surface as discussed in step S21 of FIG. 4; and removing the oxidation layer and at least a portion of the surface defects and expositing a treated trench surface, the treated trench surface being substantially free from surface defects as discussed in step S22 of FIG. 4.

Figure 7A:
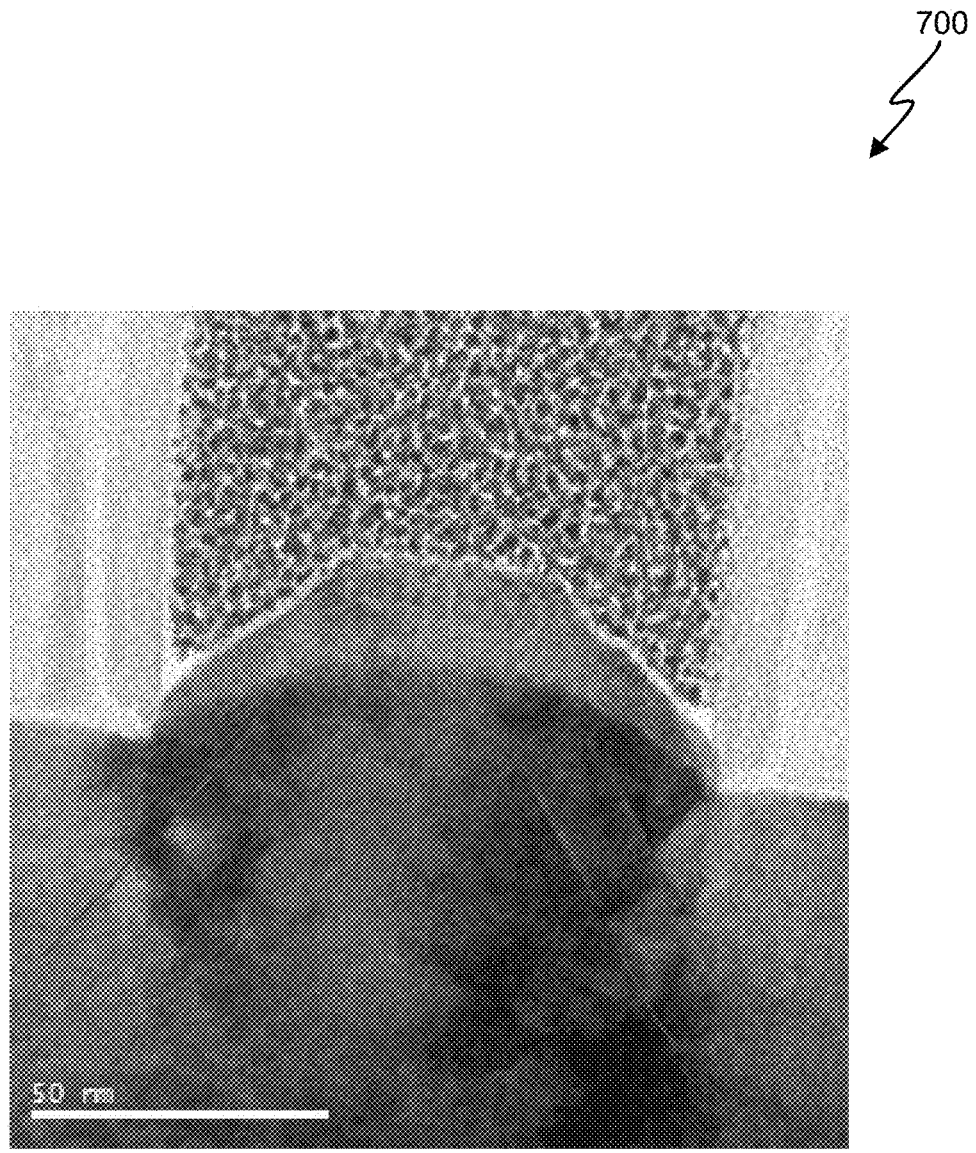
FIG. 7A-7B illustrate TEM photo of an e-SiGe film before using of an oxidation layer and after using the oxidation layer in the preparation method according to an embodiment of the present invention.
Figure 7B:
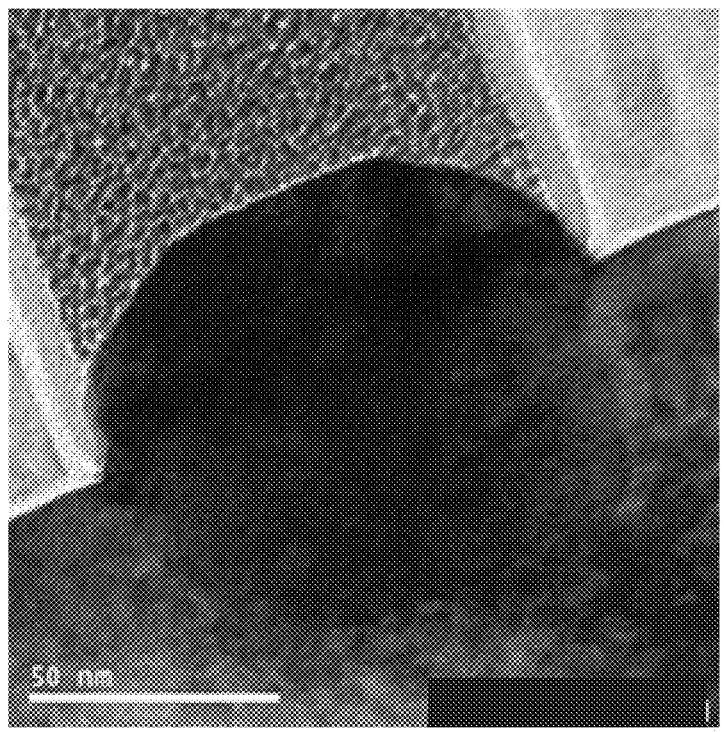

FIG. 7A shows a TEM photo of one e-SiGe film 700 without the treatment of the oxidation layer 221, and FIG. 7B shows a TEM photo of another e-SiGe film 710 after after using the oxidation layer 221 treatment. With the treatment of the oxidation layer 221, the e-SiGe film 710 has regularly SiGe crystal growing along the lattice direction with flat surfaces of the trench region 120. The use of the oxidation-deoxidation layer treatment, dislocation and misplaced problems are avoided and the morphology of the SiGe growth is improved.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for processing a semiconductor substrate, the method comprising:
   providing a substrate, the substrate comprises silicon material;
   defining a trench region;
   removing the trench region using a plasma etching process and exposing a trench surface, the trench surface comprising surface defects;
   forming an oxidation layer overlaying the trench surface;
   removing the oxidation layer and at least a portion of the surface defects;
   expositing a treated trench surface, the treated trench surface being substantially free from surface defects, the surface defect comprising a polymer material; and
   forming a layer of silicon germanium material overlaying the treated trench surface.

2. The method of claim 1, wherein the silicon germanium material is substantially free from surface defects.

3. The method of claim 1, wherein the surface defects comprise misaligned silicon material.

4. The method of claim 1, wherein the oxidation layer is embedded with at least a portion of the surface defects.

5. The method of claim 1, further comprising subjecting the trench surface to a plasma to form the oxidation layer.

6. The method of claim 1, wherein the trench surface is subjected to an oxidation treatment by a plasma etching machine.

7. The method of claim 1, wherein the forming of the oxidation layer further comprises a flow rate of oxide gas of 20 sccm-50 sccm; a source power of 300 w-500 w; a bias voltage of 0; and a treatment time of 5 s-15 s.

8. The method of claim 7, wherein the oxide gas is oxygen.

9. The method of claim 1, wherein removing the oxidation layer is characterized by:
   a flow rate of gas of 10 sccm-50 sccm;
   a source power of 200 w-400 w;
   a bias voltage of 0; a removing time is 5 s-15 s;
   a relative molecular mass of gas being not greater than 100; and
   a carbon content being not greater than 30% in gas molecules.

10. The method of claim 9, wherein the gas is selected from a group comprises nitrogen trifluoride, carbon tetrafluoride, fluoroform and sulfur hexafluoride.

11. The method of claim 1, wherein the oxidation layer is having a thickness of 2 nm-8 nm.

12. The method of claim 1, wherein the substrate is made of materials selected from a group comprises polycrystalline silicon, monocrystalline silicon and metal.

13. A method for processing a semiconductor substrate, the method comprising:
   providing a substrate, the substrate comprises a silicon material;
   defining a trench region;
   removing the trench region using a plasma etching process and exposing a trench surface, the trench surface comprising surface defects, the surface defects comprising silicon and polymer material;
   subjecting the trench surface to plurality of gaseous species to form an oxidation layer overlaying the trench surface, the oxidation layer being less than 10 nm in thickness;
   removing the oxidation layer and at least a portion of the surface defects;
   expositing a treated trench surface, the treated trench surface being substantially free from surface defects; and
   forming a layer of silicon germanium material overlaying the treated trench surface.

14. The method of claim 13 wherein the removing the oxidation layer comprises a plasma etching process.

15. The method of claim 13 wherein the removing the oxidation layer comprises a wet etching process.

16. A method for processing a semiconductor substrate, the method comprising:
   providing a substrate, the substrate comprises a silicon material;
   defining a trench region;
   removing the trench region using a plasma etching process and exposing a trench surface, the trench surface comprising surface defects;
   forming an oxidation layer overlaying the trench surface;
   removing the oxidation layer and at least a portion of the surface defects;
   repeating the steps of forming and removing the oxidation layer;
   expositing a treated trench surface, the treated trench surface being substantially free from surface defects;
   forming a layer of silicon germanium material overlaying the treated trench surface; and
   forming a drain or a source region using the layer of silicon germanium material.

* * * * *